United States Patent
Kobayashi et al.

(10) Patent No.: US 7,803,705 B2
(45) Date of Patent: Sep. 28, 2010

(54) MANUFACTURING METHOD OF SEMICONDUCTOR DEVICE AND FILM DEPOSITION SYSTEM

(75) Inventors: Yasuo Kobayashi, Nirasaki (JP);
Kenichi Nishizawa, Kikuyo-Machi (JP);
Takatoshi Kameshima, Nirasaki (JP);
Takaaki Matsuoka, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 648 days.

(21) Appl. No.: 10/585,994

(22) PCT Filed: Jan. 13, 2005

(86) PCT No.: PCT/JP2005/000297
§ 371 (c)(1),
(2), (4) Date: Jul. 13, 2006

(87) PCT Pub. No.: WO2005/069367
PCT Pub. Date: Jul. 28, 2005

(65) Prior Publication Data
US 2008/0254641 A1    Oct. 16, 2008

(30) Foreign Application Priority Data
Jan. 13, 2004   (JP)   ............................ 2004-005738
Oct. 1, 2004    (JP)   ............................ 2004-290846

(51) Int. Cl.
H01L 21/4763 (2006.01)
H01L 21/31 (2006.01)
(52) U.S. Cl. ................ 438/623; 438/783; 257/E21.584
(58) Field of Classification Search ................ 438/623, 438/783; 257/E21.584
See application file for complete search history.

(56) References Cited

U.S. PATENT DOCUMENTS

| 5,698,901 A | 12/1997 | Endo |
| 6,033,979 A | 3/2000 | Endo |
| 6,149,730 A * | 11/2000 | Matsubara et al. .......... 118/728 |

(Continued)

FOREIGN PATENT DOCUMENTS

JP      08-236517      9/1996

(Continued)

OTHER PUBLICATIONS

Notification of Transmittal of Copies of Translation of the International Preliminary Report on Patentability (Form PCT/IB/338)—PCT/JP2005/000297, dated Jan. 2004.

(Continued)

*Primary Examiner*—Khiem D Nguyen
*Assistant Examiner*—Kevin Parendo
(74) *Attorney, Agent, or Firm*—Smith, Gambrell & Russell, LLP

(57) ABSTRACT

A dielectric film (91) made of CF is deposited on a substrate. A protective layer comprising an SiCN film (93) is formed on the dielectric film (91). A film (94) serving as a hardmask made of SiCO is deposited on the protective layer by a plasma containing active species of silicon, carbon, and oxygen. When the protective layer is formed, an SiC film (92) is deposited on the dielectric film (91) by a plasma containing active species of silicon and carbon, and thereafter the SiCN film (93) is deposited on the SiC film (92) by a plasma containing active species of silicon, carbon, and nitrogen.

8 Claims, 9 Drawing Sheets

U.S. PATENT DOCUMENTS

| | | | |
|---|---|---|---|
| 6,429,518 B1 * | 8/2002 | Endo | 257/753 |
| 6,737,746 B2 * | 5/2004 | Matsuura | 257/759 |
| 6,764,939 B1 | 7/2004 | Yoshitaka | |
| 6,875,687 B1 | 4/2005 | Weidman et al. | |
| 7,199,046 B2 * | 4/2007 | Wetzel et al. | 438/637 |
| 2003/0003765 A1 * | 1/2003 | Gibson et al. | 438/760 |
| 2004/0036076 A1 * | 2/2004 | Arita et al. | 257/79 |

FOREIGN PATENT DOCUMENTS

| | | |
|---|---|---|
| JP | 09-237783 | 9/1997 |
| JP | 10-144667 | 5/1998 |
| JP | 11-176820 | 7/1999 |
| JP | 2000-068261 | 3/2000 |
| JP | 2000-114252 | 4/2000 |
| JP | 2000-223485 | 8/2000 |

OTHER PUBLICATIONS

PCT International Preliminary Report on Patentability (Form PCT/IB/373)—PCT/JP2005/000297, dated Jan. 2004.

Translation of PCT Written Opinion of the International Searching Authority—(Form PCT/ISA/237)—PCT/JP2005/000297, dated Jan. 2004.

* cited by examiner

MANUFACTURING METHOD OF SEMICONDUCTOR DEVICE AND FILM DEPOSITION SYSTEM

FIELD OF THE INVENTION

The present invention relates to a manufacturing method of a semiconductor device having a dielectric film made of fluorine-added carbon, and a film deposition system for manufacturing such a semiconductor device.

BACKGROUND ART

One of the techniques for achieving a higher degree of integration of a semiconductor device is to multilayer a wiring. When forming a multilayered wiring structure, an n-th wiring layer and an (n+1)-th wiring layer are connected to each other through a conductive layer, and films called "interlayer dielectric films" are deposited on an area other than the conductive layer. A representative interlayer dielectric film is an $SiO_2$ film. With a view to realizing a higher speed of an operation of the device, a lower relative dielectric constant of the interlayer dielectric film has been recently demanded. In consideration of this demand, a fluorine-added carbon film (fluorocarbon film), which is a compound of carbon (C) and fluorine (F), has attracted attention. The fluorine-added carbon film can have a relative dielectric constant equal to or less than 2.5, for example, by selecting a material gas of a suitable kind. Thus, as compared with the $SiO_2$ film of a relative dielectric constant around 4, the fluorine-added carbon film is considered to be a significantly efficient film as an interlayer dielectric film.

JP10-144667A describes an art for depositing a fluorine-added carbon film on a semiconductor wafer (hereinafter referred to as "wafer"), with the use of an electron cyclotron resonance (ECR) plasma-processing apparatus. Specifically, a gas for generating a plasma, such as Ar gas, is converted into a plasma by exciting ECR by an interaction of a microwave and a magnetic field. The plasma converts a material gas into a plasma, whereby a fluorine-added carbon film is deposited.

As described in JP10-144667A, since the fluorine-added carbon film is an organic film, a gas that etches the film also etches a resist film made of an organic material. Thus, when etching the fluorine-added carbon film on which the resist film is directly formed, a thickness of the resist film should be greater than that of the fluorine-added carbon film. Further, when the resist film is removed by ashing by means of an oxygen plasma, the fluorine-added carbon film is undesirably removed.

Thus, when the fluorine-added carbon film is etched, it is necessary to form a thin film serving as a hardmask on the fluorine-added carbon film. Silicon oxide and silicon nitride are known as a material for the film as a hardmask. However, use of these materials is disadvantageous in that a higher relative dielectric constant thereof increases a relative dielectric constant of the overall interlayer dielectric films.

The inventor has paid attention to, as a material for a hardmask, an oxygen-added silicon carbide (SiCO) film and a nitrogen-added silicon carbide (SiCN) film of a lower relative dielectric constant. The SiCO film is a silicon carbide film that contains about 20 atomic % of oxygen, and the SiCN film is a silicon carbide film that contains about 10 atomic % of nitrogen. In particular, the former SiCO film appears to be an effective film in view of the following advantages thereof. For example, the SiCO film is excellent in adhesion to a silicon nitride film and a silicone carbide film that function as a barrier layer for preventing diffusion of copper, when copper used as a wiring is embedded in the interlayer dielectric film. After the copper has been embedded, the interlayer dielectric film is subjected to a polishing process called CMP so as to remove the copper on the interlayer dielectric film. The SiCO film has a high resistance to the CMP.

However, there is a problem with the SiCO film. That is, when the SiCO film is deposited on the fluorine-added carbon film, a vapor (gas) of an organic compound, such as trimethyl silane, and oxygen gas are converted into a plasma. At this time, active species of oxygen react with the carbon contained in the fluorine-added carbon film to generate and release $CO_2$. It is known that, when the fluorine-added carbon film is heated under an atmosphere where only a slight amount of oxygen such as 1 ppm exists, a degassing amount from the film is increased. Thus, denseness of a surface of the fluorine-added carbon film is decreased, which impairs an adhesion between the same and the SiCO film.

The SiCN film does not have a sufficient adhesion to the fluorine-added carbon film, although the SiCO film is worse, and thus there is concern that a yield is lowered. The reason therefor is supposed as follows: When the SiCN film is deposited, a vapor of an organic compound, such as trimethyl silane, and nitrogen gas are converted into a plasma. At this time, nitrogen in the plasma permeates the fluorine-added carbon film at an initial stage of the film deposition process. The nitrogen permeating the fluorine-added carbon film is released during the film deposition process, so that denseness of the fluorine-added carbon film is degraded. As a result, it is supposed that the adhesion between the SiCN film and the fluorine-added carbon film is deteriorated.

DISCLOSURE OF THE INVENTION

The present invention has been made in view of the above context. It is the object of the present invention to provide a manufacturing method of a semiconductor device in which an excellent adhesion between the fluorine-added carbon film and a thin film serving as a hardmask deposited thereon can be attained. It is also the object of the present invention to provide a film deposition system for manufacturing such a semiconductor device.

According to an aspect of the present invention, there is provided a manufacturing method of a semiconductor device, comprising the steps of:

depositing on a substrate a dielectric film made of fluorine-added carbon;

forming on the dielectric film a protective layer comprising a nitrogen-added silicon carbide film; and depositing on the protective layer a thin film serving as a hardmask made of oxygen-added silicon carbide by a plasma containing active species of silicon, carbon, and oxygen.

For example, the plasma containing active species of silicon, carbon, and oxygen is a plasma obtained by activating a gas of an organic silicon compound and an oxygen gas.

Preferably, the step of forming the protective layer includes the sub-steps of:

depositing on the dielectric film a silicon carbide film by a plasma containing active species of silicon and carbon; and depositing on the silicon carbide film a nitrogen-added silicon carbide film by a plasma containing active species of silicon, carbon, and nitrogen.

The step of forming the protective layer may include the sub-steps of:

depositing on the dielectric film a silicon carbide film by a plasma obtained by activating a gas of an organic silicon compound; and depositing on the silicon carbide film a nitrogen-added silicon carbide film by a plasma containing active species of an organic silicon compound and active species of nitrogen.

More specifically, the manufacturing method may further comprise the steps of:

forming on the thin film serving as a hardmask a resist film having a specific pattern;

etching the thin film by a plasma through the resist film to obtain a hardmask having a pattern corresponding to that of the resist film; and etching the dielectric film by a plasma through the hardmask.

According to the same aspect of the present invention, there is further provided a manufacturing method of a semiconductor device, comprising the steps of:

depositing on a substrate a dielectric film made of fluorine-added carbon;

depositing on the dielectric film a silicon carbide film by a plasma containing active species of silicon and carbon; and depositing on the silicon carbide film a thin film serving as a hardmask made of nitrogen-added silicon carbide by a plasma containing active species of silicon, carbon, and nitrogen.

For example, the plasma containing active species of silicon and carbon is a plasma obtained by activating a gas of an organic silicon compound. For example, the plasma containing active species of silicon, carbon, and nitrogen is a plasma obtained by activating a gas of an organic silicon compound and a nitrogen gas.

According to another aspect of the present invention, there is provided a film deposition system comprising:

a first processing vessel that receives a substrate;

first means that generates in the first processing vessel a first plasma containing active species of carbon and fluorine;

a second processing vessel that receives the substrate;

second means that forms in the second processing vessel an atmosphere for depositing a nitrogen-added silicon carbide film;

a third processing vessel that receives the substrate;

third means that generates in the third processing vessel a second plasma containing active species of silicon, carbon, and oxygen; and a controller that controls the first, second, and third means to execute the steps of:

(a) generating in the first processing vessel the first plasma by the first means to deposit on the substrate a dielectric film made of fluorine-added carbon;

(b) forming in the second processing vessel the atmosphere by the second means to deposit on the dielectric film a protective layer comprising a nitrogen-added silicon carbide film; and (c) generating in the third processing vessel the second plasma by the third means to deposit on the protective layer a thin film serving as a hardmask made of oxygen-added silicon carbide.

A single processing vessel can be used as at least two of the first, second, and third processing vessels.

According to the same aspect of the present invention, there is further provided a film deposition system comprising:

a first processing vessel that receives a substrate;

first means that generates in the first processing vessel a first plasma containing active species of carbon and fluorine;

a second processing vessel that receives the substrate;

a first gas supply system that supplies into the second processing vessel a first process gas containing silicon and carbon, while controlling a flow rate of the gas;

a second gas supply system that supplies into the second processing vessel a second process gas containing nitrogen, while controlling a flow rate of the gas;

second means that converts the first and second process gasses supplied into the second processing vessel into a plasma; and a controller that controls the first and second means, and the first and second gas supply systems to execute the steps of:

(a) generating in the first processing vessel the first plasma by the first means to deposit on the substrate a dielectric film made of fluorine-added carbon;

(b) converting in the second processing vessel the first process gas supplied by the first gas supply system into a plasma by the second means to deposit on the dielectric film a silicon carbide film; and (c) converting in the second processing vessel the first and second process gases supplied by the first and second gas supply systems into a plasma by the second means to deposit on the silicon carbide film a thin film serving as a hardmask made of nitrogen-added silicon carbide.

A single processing vessel can be used as the first and second processing vessels.

In these film deposition systems, the plasma generating means may include a supply system that supplies a gas and an activating energy for generating a plasma in the processing vessel.

BEST MODE FOR CARRYING OUT THE INVENTION

Figure 4:
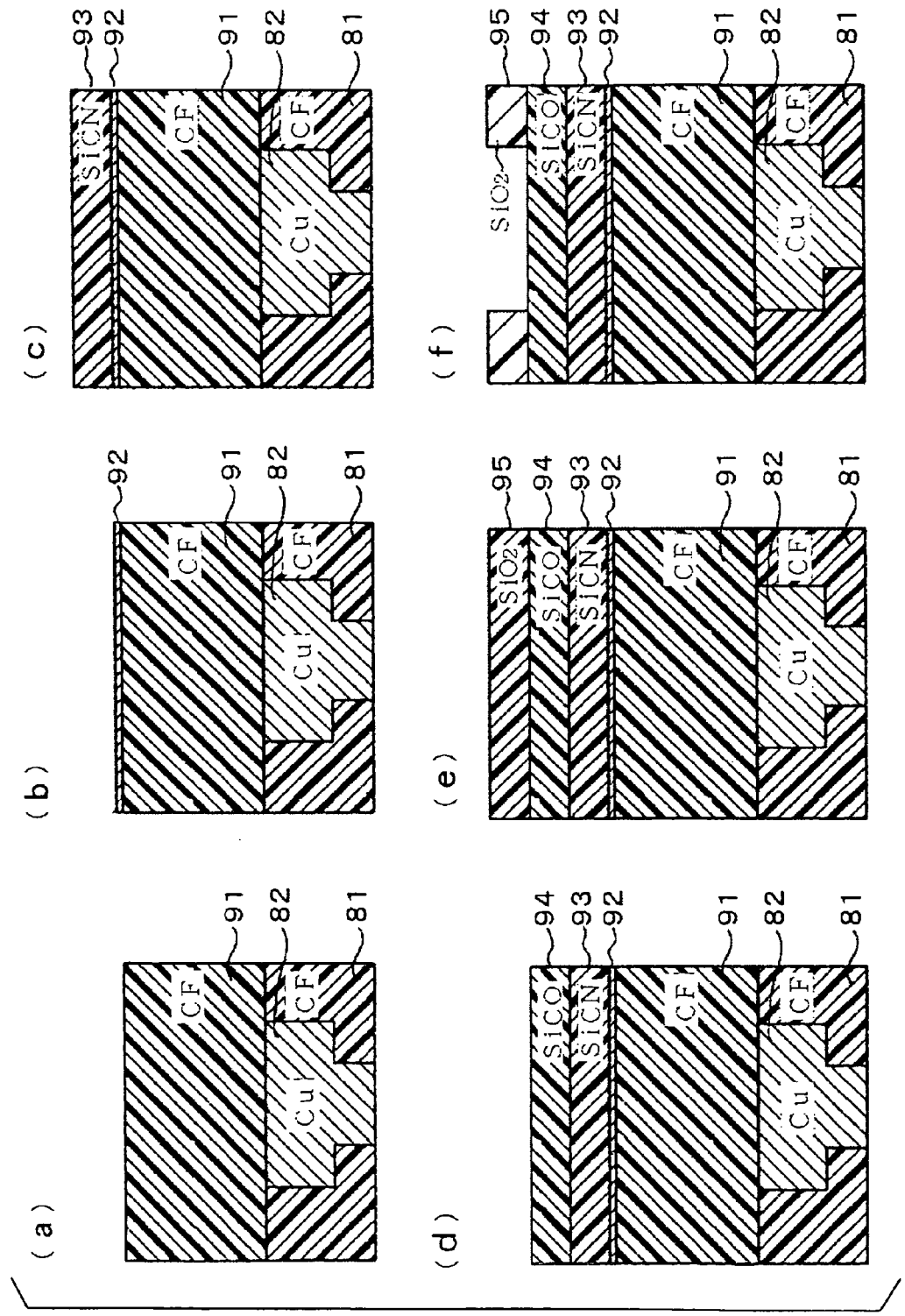
FIG. 4 shows sectional views of the manufacturing steps (a) to (f) of a semiconductor device in a first embodiment of the present invention.
Figure 5:
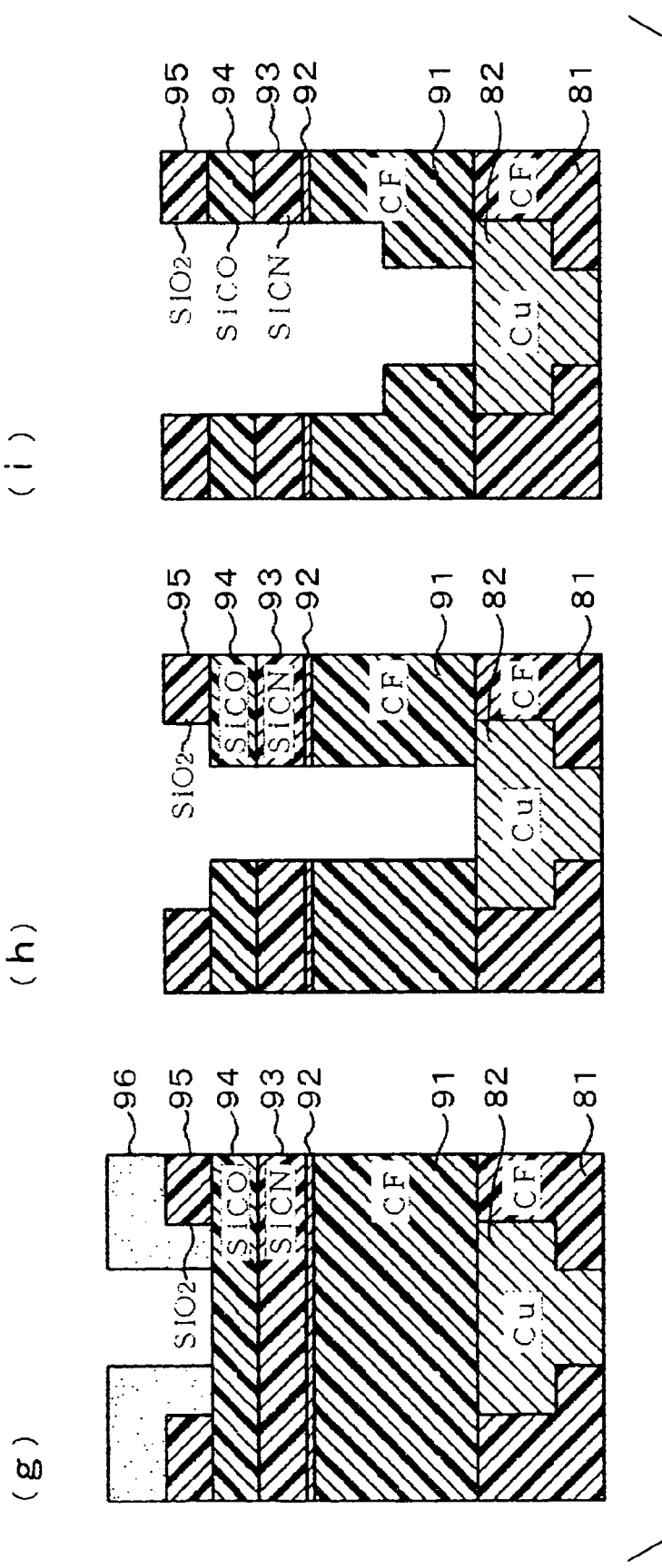
FIG. 5 shows sectional views of the manufacturing steps (g) to (i) of the semiconductor device in the first embodiment of the present invention.
Figure 6:
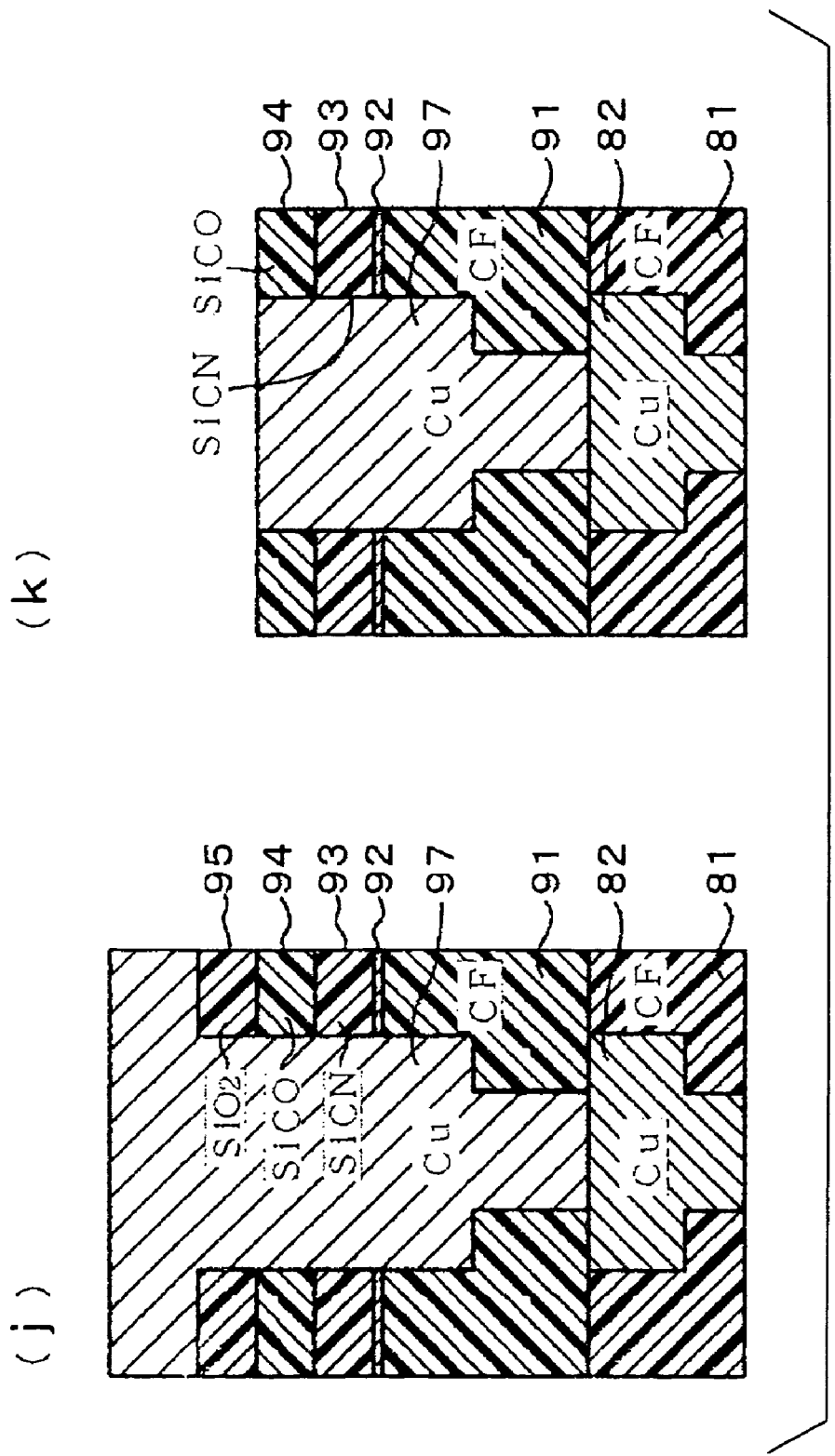
FIG. 6 shows sectional view of the manufacturing steps (j) to (k) of the semiconductor device in the first embodiment of the present invention.

In a first embodiment of the present invention, as shown in FIGS. 4 to 6, an interlayer dielectric film 91 made of fluorine-added carbon, an SiCN (nitrogen-added silicon carbide) film 93 as a protective layer, and an SiCO (oxygen-added silicon carbide) film 94 serving as a first hardmask, are deposited on a substrate in this order. Then, an $SiO_2$ (silicon oxide) film 95 serving as a second hardmask is deposited on the SiCO film 94. Next, the fluorine-added carbon film 91 is etched with the use of the first and second hardmasks 94 and 95. Thereafter, a copper wiring is embedded in a recess formed by the etching process.

A plasma processing apparatus as a film deposition system used in this embodiment is described with reference to FIGS. 1 to 3.

Figure 1:
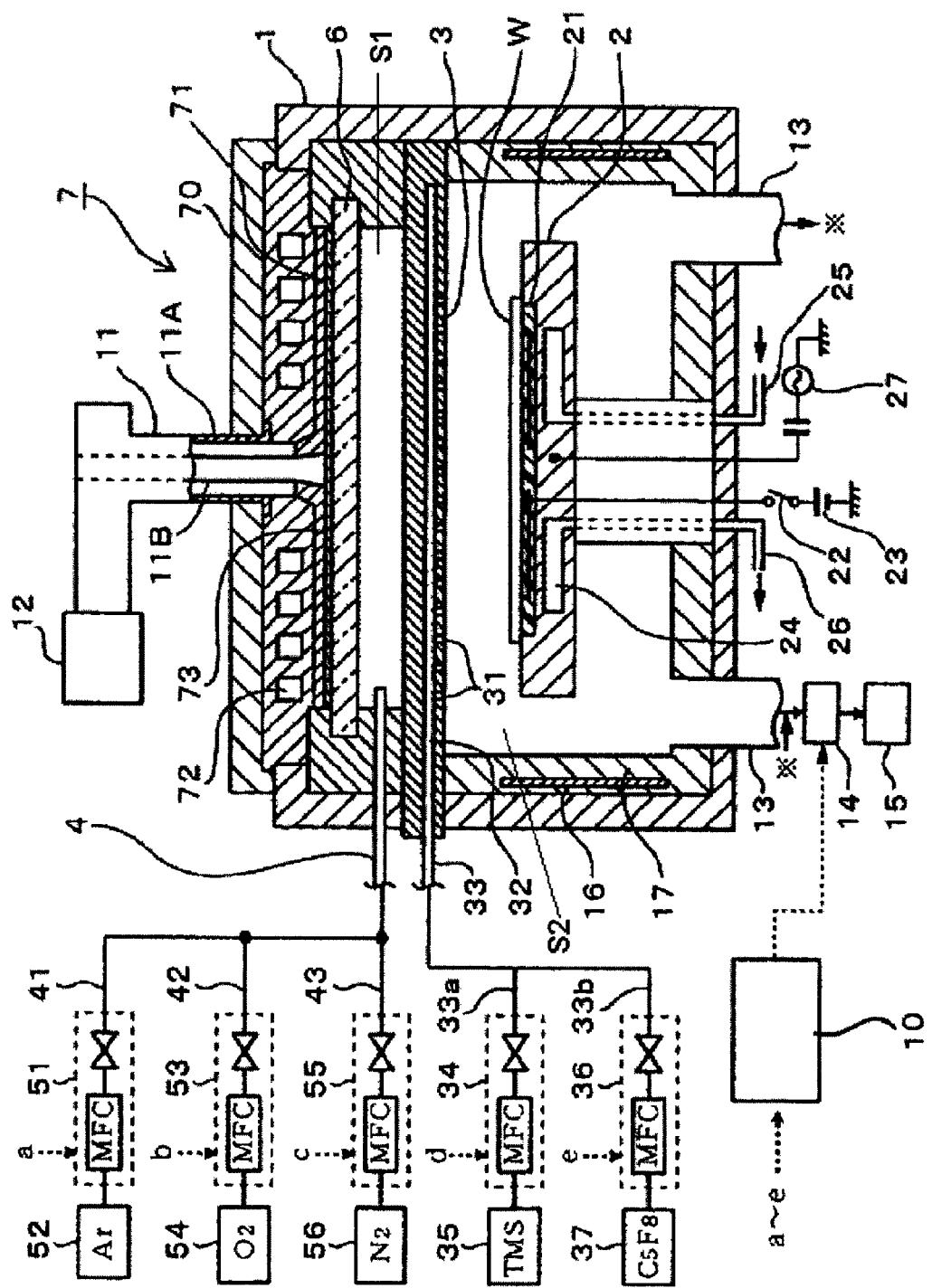
FIG. 1 is a sectional view of a plasma processing apparatus in one embodiment of the present invention.

In FIG. 1, the reference number 1 depicts a processing vessel made of, e.g. aluminum. In the processing vessel 1, there is disposed a table 2 made of, e.g., aluminum nitride or aluminum oxide, on which a semiconductor wafer (hereinafter referred to as "wafer") W as a substrate is arranged. The table 2 is provided, on its surface, with an electrostatic chuck 21. An electrode of the electrostatic chuck 21 is connected to a direct-current power supply 23 via a switch 22. A channel 24 is formed in the table 2, through which a temperature-adjusting medium as temperature-adjusting means flows. A coolant flowing from an inlet channel 25 passes through the channel 24, and is discharged from an outlet channel 26. Due to the coolant flowing through the channel 24 and a heater, not shown, the wafer W arranged on the table 2 can be maintained at a predetermined temperature. A high-frequency power supply 27 that supplies a biasing high-frequency power of, e.g., 13.56 MHz is connected to the table 2.

A substantially disc-shaped gas supply member (showerhead) 3 made of a conductive material, such as aluminum, is disposed above the table 2. The gas supply member 3 separates an inside space of the processing vessel 1 into an upper plasma generating space S1 and a lower processing process S2. The gas supply member 3 has a plurality of gas supply holes 31 formed in a lower surface thereof facing the table 2. Gas channels 32 in the form of a lattice are formed in the gas supply member 3 to communicate with the gas supply holes 31 (see, FIG. 2).

A proximal end side of a gas supply channel 33 is diverged into branching pipes 33a and 33b. To one branching pipe 33a, there is connected a gas supply source 35 that supplies TMS (trimethyl silane: $SiH(CH_3)_3$) vapor that is a gas of an organic silicon compound, through a gas supply apparatus group 34. To the other branching pipe 33b, there is connected a gas supply source 37 that supplies a film deposition gas as a process gas containing carbon and fluorine, such as $C_5F_8$ gas, through a gas supply apparatus group 36. The gas supply apparatus groups 34 and 36 respectively include valves and massflow controllers as flow-rate adjusters.

Of these constituent members, the gas supply member 3, the gas supply channel 33, the branching pipe 33a, the gas supply apparatus group 34, and the gas supply source 35 constitute a first gas supply system that supplies TMS gas as a first process gas, while controlling a flow rate thereof.

Figure 2:
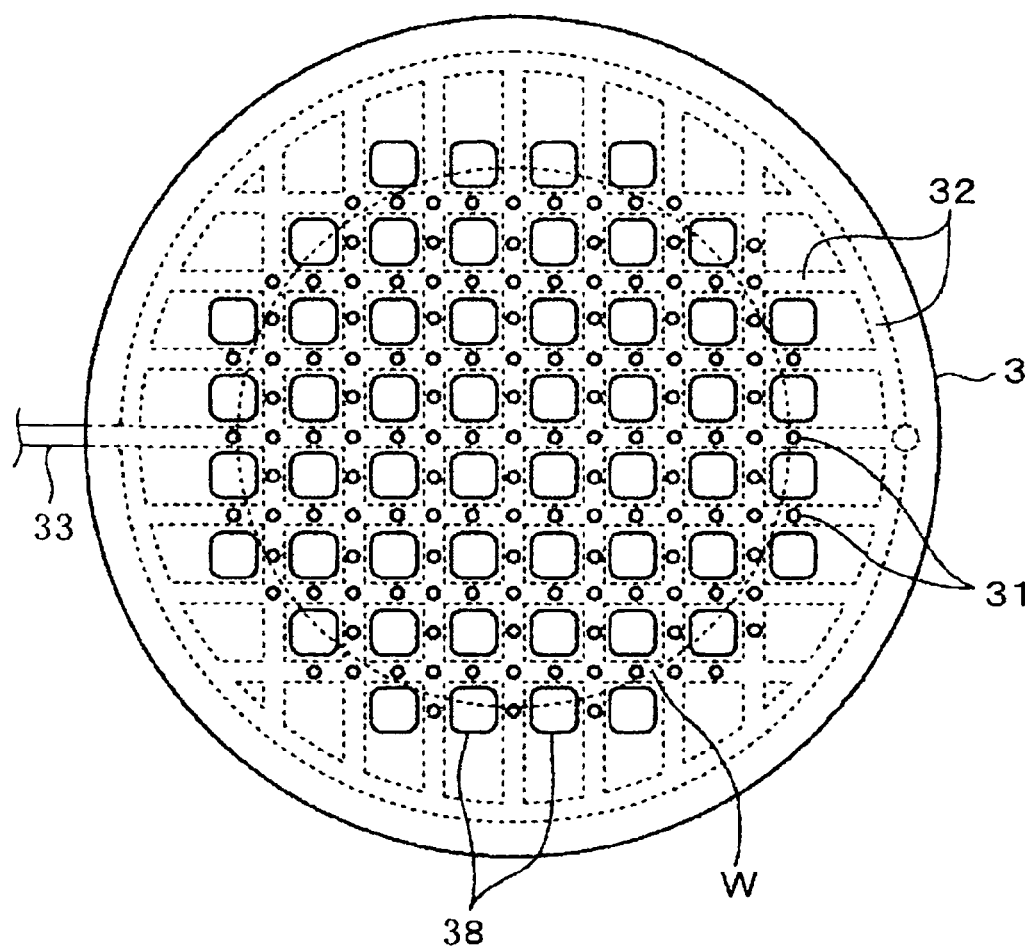
FIG. 2 is a bottom view of a gas supply member in the plasma processing apparatus shown in FIG. 1.

As shown in FIG. 2, a plurality of through-holes 38 are formed to vertically pass through the gas supply member 3. Due to the provision of these through-holes 38, active species generated in the plasma processing space S1 can come down to the processing space S2. Each through-hole 38 is formed between the gas channels 32 adjacent to each other.

A distal end side of a gas supply channel 4 in communication with an inside of the plasma generating space S1 is connected to the processing vessel 1. A proximal end side of the gas supply channel 4 is diverged into branching pipes 41, 42, and 43. To the branching pipe 41, there are connected a gas supply apparatus group 51, and a supply source 52 that supplies a rare gas, such as Ar (argon) gas. To the branching pipe 42, there are connected a gas supply apparatus group 53, and a supply source 54 that supplies $O_2$ (oxygen) gas. To the branching pipe 43, there are connected a gas supply apparatus group 55, and a supply source 56 that supplies $N_2$ (nitrogen) gas. The gas supply apparatus groups 51, 53, and 55 respectively include valves and massflow controllers.

Of these constituent members, the gas supply channel 4, the branching pipe 43, the gas supply apparatus group 55, and the gas supply source 56 constitute a second gas supply system that supplies $N_2$ gas as a second process gas, while controlling a flow rate thereof.

Not limited to the above example, a structure for supplying gases may be formed as follows. That is, a first gas channel for $C_5F_8$ gas and TMS gas, and a second gas channel for oxygen gas and nitrogen gas are independently disposed in the gas supply member 3. The gas supply holes 31 are divided into first supply holes in communication with the first gas channel, and second supply holes in communication with the second gas channel. The first gas supply holes and the second gas supply holes are alternately arranged, for example. Such a structure for supplying gases can provide an intrafilm uniformity excellent in quality and thickness of a film deposited on the wafer W.

A dielectric plate (microwave transmission window) 6 made of a material capable of transmitting a microwave, such as alumina ($Al_2O_3$) or quartz, is disposed above the gas supply member 3. An antenna 7 is disposed on the dielectric plate 6 such that the antenna 7 and the plate 6 are in tight contact with each other. As shown in FIG. 3, the antenna 7 is provided with a disc-shaped antenna body 70, and a planar antenna member (slot plate) 71 of a disc-shape disposed on a lower surface side of the antenna body 70. The antenna body 70 and the planar antenna member 71 are formed of a conductive material, and a flat circular waveguide is formed therebetween. In the example shown in FIG. 1, the antenna body 70 is divided into two members, i.e., an upper member and a lower member. Inside the lower member, there is formed a coolant receiver 72 in which a coolant flowing thereinto from an outside coolant channel is circulated.

Between the planar antenna member 71 and the antenna body 70, there is disposed a slow-phase plate (lagging plate) 73 made of a low-loss dielectric material, such as alumina, silicon oxide, and silicon nitride. The slow-phase plate 73 shortens a wavelength of a microwave so as to shorten a guide wavelength in the circular waveguide. The antenna body 70, the planar antenna member 71, and the slow-phase plate 73 constitute a radial line slot antenna (RLSA).

The antenna 7 as structured above is mounted on the processing vessel 1 through a sealing member, not shown, such that the planar antenna member 71 is in tight contact with the dielectric plate 6. The antenna 7 is connected to a microwave generator 12 that supplies a microwave of, e.g., 2.45 GHz or 8.4 GHz through a coaxial waveguide 11. The coaxial waveguide 11 includes an outside waveguide 11A that is connected to the antenna body 70, and a central conductor 11B that passes through the slow-phase plate 73 to be connected to the planar antenna member 71.

Figure 3:
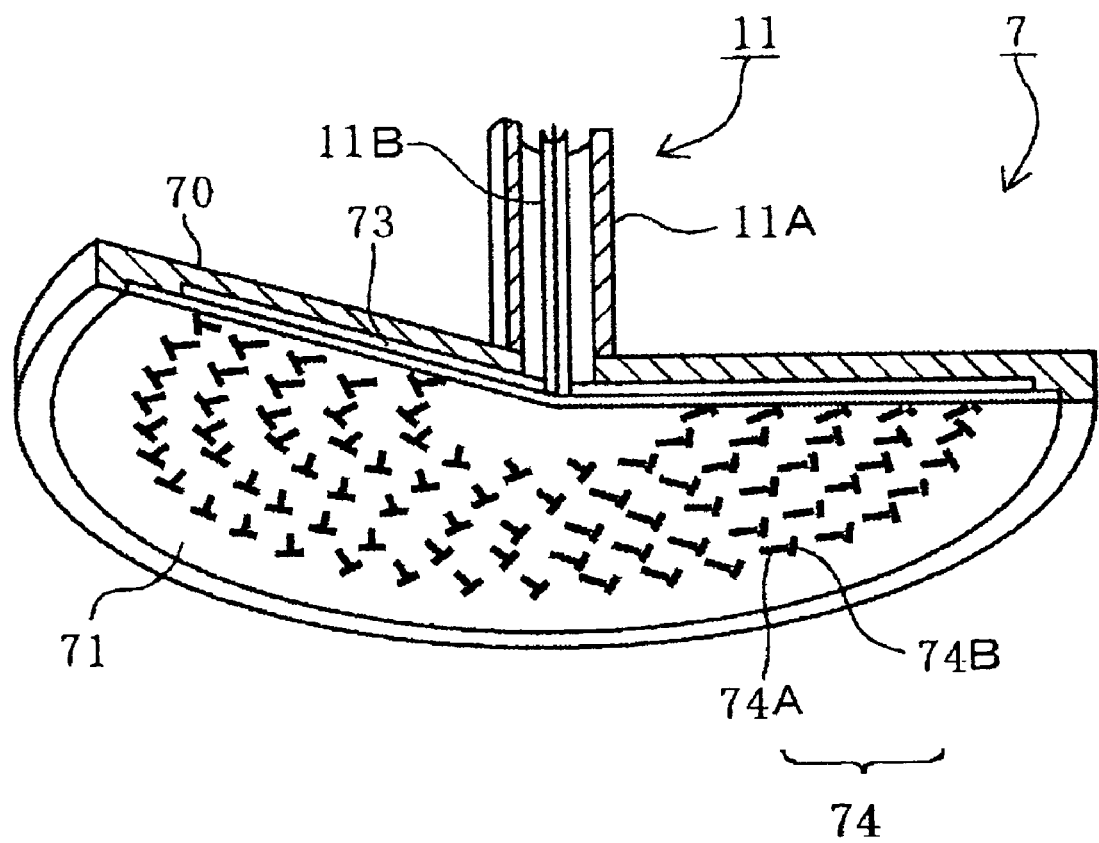
FIG. 3 is a partially cut-away perspective view of an antenna in the plasma processing apparatus shown in FIG. 1.

As shown in FIG. 3, the planar antenna member 71, which is formed of a copper plate with a thickness of e.g., about 1 mm, has a plurality of slot portions 74. Each of the slot portions 74 has a pair of slots 74A and 74B that are positioned with a slight clearance therebetween to form a shape substantially resembling a character "T". The slot portions 74 are concentrically or spirally arranged in the planar antenna member 71 in a circumferential direction thereof. Since the slot 74A and the slot 74B are arranged substantially perpendicular to each other to form each slot portion 74, a circularly-polarized wave containing two polarization components that are perpendicular to each other is radiated. By arranging the pair of slots 74A and 74B with a clearance therebetween corresponding to a wavelength of the microwave compressed by the slow-phase plate 73, the microwave is radiated from the planar antenna member 71 as an almost plane wave.

As shown in FIG. 1, an evacuation pipe 13 is connected to a bottom of the processing vessel 1. A vacuum pump 15 is connected to a proximal end side of the evacuation pipe 13 through a pressure adjuster 14 formed of, e.g., a butterfly valve. A sleeve 17 in which a heater 16 is built-in is disposed on an inner wall of the processing vessel 1.

The plasma processing apparatus includes a controller 10 that controls the gas supply apparatus groups 34, 36, 51, 53, and 55, the pressure adjuster 14, the heater 16, the microwave generator 12, and the switch 22 for the electrostatic chuck. The controller 10 has a storage part that stores a sequence program for executing steps of the below-described film deposition process performed in the processing vessel 1.

Next, an example of the film deposition method carried out by the apparatus is described.

At first, the wafer W as a substrate is loaded into the processing vessel 1 via a gate valve, not shown, and is disposed on the table 2. As shown in FIG. 4(a), the wafer W used herein includes an interlayer dielectric film 81 made of fluorine-added carbon and a copper wiring 82 that are previously formed on a surface of the wafer W.

Then, an atmosphere of the processing vessel 1 is evacuated to a predetermined pressure. Into the processing vessel 1, Ar gas as a plasma gas is supplied through the gas supply channel 4, while $C_5F_8$ gas as a material gas is supplied from the gas supply member 3 through the gas supply channel 33. A surface temperature of the table 2 is set at a predetermined one, while maintaining the atmosphere of the processing vessel 1 at a predetermined process pressure.

Meanwhile, a 2000 watt microwave at 2.45 GHz is supplied from the microwave generator 12. The microwave propagates in the coaxial waveguide 11 in a TM mode, TE mode, or TEM mode. The microwave that has reached the antenna 7 radially propagates from a center of the planar antenna member 71 toward a periphery thereof, through the inside conductor 11 of the coaxial waveguide 11. During this, the microwave is radiated downward from the slots 74A and 74B through the dielectric plate 6. Since the dielectric plate 6 is made of a material, such as alumina, that can transmit a microwave, the radiated microwave can efficiently pass through the dielectric plate 6.

Owing to the arrangement of the slots 74A and 74B (FIG. 3), the microwave can be uniformly released as a circularly polarized wave from the overall plane of the planar antenna member 71, whereby a field density of the lower plasma generating space S1 is uniformized. An energy of the microwave excites a uniform plasma of Ar gas of a high density in the plasma generating space S1.

The plasma goes down to the lower processing space S2 via the through-holes 38 in the gas supply member 3. The plasma activates the $C_5F_8$ gas supplied from the gas supply member 3 into the processing space S2 to form active species. The active species are deposited on the surface of the wafer W to form thereon an interlayer dielectric film 91 made of fluorine-added carbon having a thickness of, e.g., 200 nm, as shown in FIG. 4(a). That is, in the plasma processing apparatus, the processing space S2 (no plasma emission occurs in this space) where the active spices mainly exist is defined below the plasma generating space S1, with the gas supply member 3 being interposed between the spaces S1 and S2. Thus, the fluorine-added carbon film is deposited by the so-called "soft" active species. Accordingly, a dense fluorine-added carbon film excellent in adhesion and thermal stability can be obtained.

Then, an SiCN film and an SiCO film are sequentially deposited on the interlayer dielectric film 91 made of fluorine-added carbon, without unloading the wafer W from the processing vessel 1.

The film deposition process of the SiCN film is described at first. In order to deposit the SiCN film, in addition to a plasma obtained by activating TMS gas, active species of nitrogen is required. However, in this embodiment, no nitrogen gas is supplied at an initial step of the film deposition process. That is, by opening the valves of the respective gas supply apparatus groups 51 and 34, only TMS gas and Ar gas are supplied into the processing vessel 1. At the same time, the atmosphere of the processing vessel 1 is maintained at a process pressure.

On the other hand, by supplying a microwave of a predetermined power at 2.45 GHz from the microwave generator 12, a plasma is excited as described above. The TMS gas supplied from the gas supply member 3 is activated (converted into a plasma) by the plasma thus generated. Therefore, active species (plasma) of silicon, carbon, and hydrogen are generated, whereby an SiC (silicon carbide) film 92 (hydrogen is contained, in more detail) is formed, as shown in FIG. 4(b).

The initial film deposition process for forming the SiC film 92 is performed for five seconds, for example. Thereafter, by opening the valve of the gas supply apparatus group 55, nitrogen gas is supplied from the gas supply channel 4 into the processing vessel 1. Thus, active species of nitrogen are generated, so that an SiCN film 93 is deposited on the SiC film 92, as shown in FIG. 4(c). A total thickness of the SiC film 92 and the SiCN film 93 is about 5 nm, for example. The SiCN film is a silicon carbide film containing, e.g., 10 atomic % of nitrogen.

The SiC film 92 functions as an adhesion layer that adheres the SiCN film 93 to the fluorine-added carbon film 91. It is supposed that, when the SiCN film 93 is deposited, the SiC film 92 prevents the nitrogen from invading the fluorine-added carbon film 91. The SiCN film 93 in this embodiment does not serve as a hardmask in itself. Instead, the SiCN film 93 acts as a protective layer that protects the fluorine-added carbon film 91. Due to the protective function of the SiCN film 93, the fluorine-added carbon film 91 is not exposed to active species of oxygen and attacked by the same, during a subsequent film deposition process of an SiCO film 94 on the SiCN film 93.

Next, the SiCO film to be used as a hardmask in the following process is deposited. In this film deposition process, the TMS gas that has been supplied for depositing the SiCN film 93 is continuously supplied, with a flow rate thereof being set in accordance with a recipe for depositing the SiCO film. Meanwhile, a supply of nitrogen gas is stopped by closing the valve of the gas supply apparatus group 55, and a supply of oxygen gas into the processing vessel 1 is started by opening the valve of the gas supply apparatus group 54. While maintaining the atmosphere of the processing vessel 1 at a predetermined process pressure, a microwave is supplied from the microwave generator 12, to thereby activate the TMS gas and the oxygen gas so as to excite a plasma. As shown in FIG. 4(d), the SiCO film 94 of, e.g., about 50 nm in thickness, that serves as a first hardmask, is formed by the plasma. The SiCO film is a silicon carbide film containing, e.g., 20 atomic % of oxygen.

In the process for depositing the SiCO film 94, only TMS gas may be supplied for, e.g., about five seconds, without supplying oxygen gas, at an initial step of the film deposition process, and subsequently oxygen gas may be supplied in addition to the TMS gas. In this case, an adhesion of the SiCO film 94 to the SiCN film 93 can further be enhanced.

Following thereto, as shown in FIG. 4(e), a film 95 serving as a second hardmask is deposited on the SiCO film 94. A material of the film 95 differs from SiCO, i.e., silicon oxide in this embodiment. This film deposition process may be carried out in the apparatus shown in FIG. 1, by a plasma obtained by activating a vapor of an organic source, such as TEOS, and oxygen gas. Alternatively, the film deposition process may be carried out in another film deposition apparatus. Thereafter, a resist film, not shown, having a specific pattern is formed on the silicon oxide film 95. The silicon oxide film 95 is etched with the resist film used as a mask, and then the resist mask is removed by ashing. Thus, the second hardmask 95 having a pattern corresponding to the pattern of the resist film is provided (FIG. 4(f)).

Subsequently, a resist film 96 is formed on a surface of the wafer W, a width of a pattern of the resist film 96 being narrower than that of the second hardmask 95 (FIG. 5(g)). With the resist film 96 used as a mask, the SiCO film 94 is etched by a plasma containing active species of a halogen compound, and then the resist film 96 is removed by ashing. Thus, the first hardmask 94 having a pattern corresponding to the pattern of the resist film 96 is provided. With the use of the first hardmask, the fluorine-added carbon film 91 is etched by, e.g., oxygen plasma (FIG. 5(h)). Note that a barrier layer and a hardmask are actually disposed on surfaces of base layers 81 and 82, but they are omitted in the drawings as a matter of convenience.

Next, with the use of the second hardmask 95 made of silicon oxide, the SiCN film 93 and the SiCO film 94 (including the SiC film 92) are etched together, and a part of the fluorine-added carbon film 91 is etched. Thus, a recess is formed (FIG. 5(i)) that has a width wider than that of the recess formed by the previous etching process. A narrower part of the recess formed in the fluorine-added carbon film 91 corresponds to a via-hole, and a wider part, which is formed above the narrower part, of the recess corresponds to an area in which a wiring of a circuit is embedded. After that, as shown in FIG. 6(j), copper 97 as a wiring metal is embedded throughout the recess. A part of the copper protruding from the recess is removed by polishing called CMP (chemical mechanical polishing), so as to form the copper wiring 97 (FIG. 6(k)). Following thereto, although not shown, a barrier layer such as an SiC layer is formed on a surface of the wafer W.

In the above embodiment, the SiCO film 94 serving as a hardmask is deposited on the fluorine-added carbon film 91, with the SiCN film 93 serving as a protective film being interposed therebetween. Thus, the SiCN film 93 prevents the active species of oxygen used for depositing the SiCO film 94 from reacting with the carbon contained in the fluorine-added carbon film 91. As a result, a degassing amount from the fluorine-added carbon film 91 can be decreased.

When the SiCN film 93 as a protective film is deposited, a surface of the fluorine-added carbon film 91 is exposed to a plasma atmosphere of TMS gas, prior to exposure to a nitrogen plasma. Thus (as described in the following item of <Example>), an adhesion between the SiCN film 93 and the fluorine-added carbon film 91 can be improved. Since both the SiCN film 93 and the SiCO film 94 are formed of silicon carbide as a base material, the films 93 and 94 well adhere to each other. As a result, an excellent adhesion between the SiCO film 94 and the fluorine-added carbon film 91 can be obtained, which enables a use of the SiCO film as a hardmask.

Research has not clearly shown the reason why the adhesion of the SiCN film is improved by exposing the surface of the fluorine-added carbon film 91 to the plasma atmosphere of TMS gas, prior to exposure to the nitrogen plasma. However (as described in the following item of <Example>), it is supposed that a carbon-rich layer formed on the surface of the fluorine-added carbon film 91 traps nitrogen. That is, it is supposed that, since a degassing of the nitrogen as a gas from the fluorine-added carbon film is prevented, a decrease in density of the film can be avoided, which improves the adhesion of the SiCN film.

In this embodiment, in addition to Ar gas, rare gases, such as He (helium) gas, Ne (neon) gas, Kr (krypton) gas, and Xe (xenon) gas, may be used for generating a plasma. Not limited to the interlayer dielectric film, the fluorine-added carbon film may be used as another dielectric film. A material gas for the fluorine-added carbon film is not limited to $C_5F_8$ gas, and $CF_4$ gas, $C_2F_6$ gas, $C_3F_8$ gas, $C_3F_6$ gas, and $C_4F_8$ gas may be used therefor.

Not limited to nitrogen gas, ammonia gas may be used for obtaining active species of nitrogen when depositing the SiCN film 93.

An organic silicon compound used for depositing the SiCN film 93 and the SiCO film 94 is not limited to TMS gas, and other organic compounds may be used. To be specific, it is possible to use $CH_3SiH_3$, $(CH_3)_2SiH_2$, $(CH_3)_3SiH$, $(CH_3)_4Si$, $(CH_3)_2Si(OC_2H_5)_2$, $(CH_3)_2Si(OCH_3)_2$, $CH_3Si(OC_2H_5)_3$, $CH_3Si(OCH_3)_3$, $(HCH_3SiO)_4$ [cyclic structure], $((CH_3)_3Si)_2O$, $(H(CH_3)_2Si)_2O$, $(H_2CH_3Si)_2O$, $((CH_3)_2SiO)_3$, $(CH_3ASiO)_3$, $((CH_3)_2SiO)_4$, $(CH_3ASiO)_4$, and so on. The last three compounds are cyclic structures, and the character "A" represents a vinyl group (CH—CH$_3$).

A second embodiment of the present invention is described below.

The second embodiment is a method in which an SiCN film itself is used as a hardmask. To be specific, the SiCN film is used as a thin film for a first hardmask, and there is disposed on the SiCN film a thin film for a second hardmask that is formed of a material different from that of the SiCN film. Thus, the SiCN film is, e.g., about 50 nm in thickness. A manufacturing method therefor is identical to that of the first embodiment. That is, at an initial step of the film deposition process of the SiCN film, only TMS gas and Ar gas are supplied without supplying nitrogen gas. Thereafter, in addition to these gases, nitrogen gas is supplied. The SiCN film 93 along with the SiCO film 94 shown in FIGS. 4 to 6 corresponds to the SiCN film serving as a thin film for a first hardmask. In this case, a second hardmask may be either a silicon oxide film or an SICO film.

In this embodiment, as described above, nitrogen is trapped by a carbon-rich layer formed on a surface of a fluorine-added carbon film. Thus, in the subsequent steps, a degassing amount from the fluorine-added carbon film can be decreased. As a result, an adhesion between the SiCN film and the fluorine-added carbon film can be remarkably enhanced.

In the above respective embodiments, the fluorine-added carbon film, the SiCN film, and the SiCO film are deposited with the use of the single processing vessel 1. However, the films may be deposited by using three processing vessels. In this case, the respective processing vessels are connected to a common vacuum conveying vessel, and a substrate is sequentially conveyed among the respective processing vessels via the conveying vessel. Alternatively, the three processing vessels may be serially connected, and a substrate is sequentially conveyed thereamong via load lock chambers separating the respective processing vessels. Alternatively, two films of the fluorine-added carbon film, the SiCN film, and the SiCO film may be deposited by the single processing vessel, and the rest film may be deposited by a different processing vessel. Further, the SiCN film may be deposited by an apparatus other than a plasma processing apparatus, e.g., a sputtering apparatus.

A third embodiment of the present invention is described below.

Figure 7:
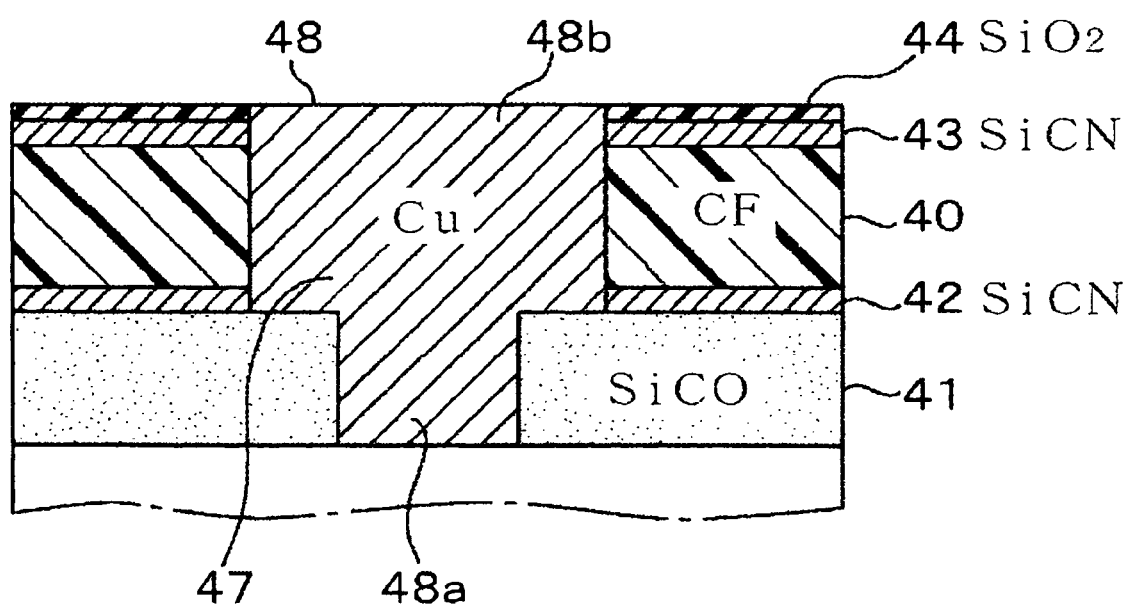
FIG. 7 is a sectional view of a part of a semiconductor device in a third embodiment of the present invention.

This embodiment is a method for providing a semiconductor device shown in FIG. 7. In the semiconductor device, an SiCN film 42 serving as a protective film is formed on a porous SiCO film 41 that constitutes a part of interlayer dielectric films. On the SiCN film 42, there is formed a fluorine-added carbon film 40 as an interlayer dielectric film. That is, the SiCO film 41 and the fluorine-added carbon film 40 are formed as the interlayer dielectric films of a two-staged structure, with the SiCN film 42 interposed therebetween. Below the interlayer dielectric films 41 and 40, there is a structure part in which a wiring is embedded. The interlayer dielectric films 41 and 40 are laminated on the structure part to constitute a part of a multi-layered structure wiring.

A recess 48 is formed in the interlayer dielectric films 41 and 40. As shown in the sectional view of FIG. 7, the recess 48 includes a narrowe recess 48a (corresponding to a via-hole) formed in the SiCO film 41 and a wider recess 48b (trench for wiring) formed in the fluorine-added carbon film 40. Copper 47 as a wiring layer, for example, is embedded in the recess 48. An SiCN film 43 as a protective film is formed on the fluorine-added carbon film 40. On the SiCN film 43, there is disposed a thin $SiO_2$ film 44 serving as a hardmask which has been subjected to a polishing process called CMP, which is described below.

Figure 8:
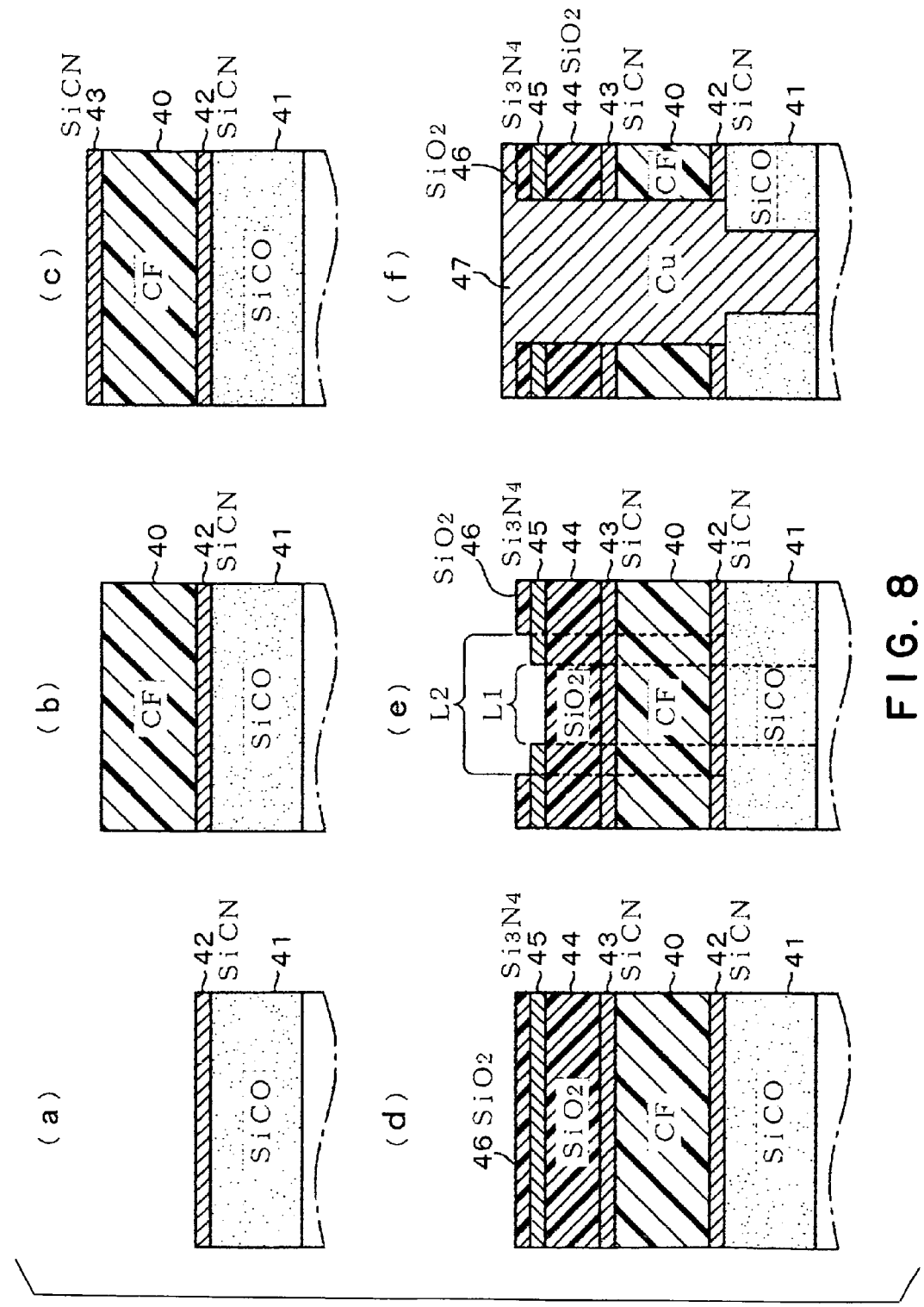
FIG. 8 shows sectional views of the manufacturing steps (a) to (f) of the semiconductor device shown in FIG. 7.

Manufacturing steps of the semiconductor device shown in FIG. 7 are described with reference to FIG. 8. The semiconductor device can be manufactured with the use of a plasma processing apparatus described with reference to FIGS. 1 to 3. This example uses a wafer W in which an interlayer dielectric film and a base layer as a wiring are previously formed on a surface of the wafer W.

First, as shown in FIG. 8(a), the porous SiCO film 41 and the SiCN film 42 as a protective film are deposited on the base layer of a wafer W. A method of depositing the porous SiCO film 41 is as follows: First, Ar gas and TMS gas are supplied into the processing vessel 1 to deposit an SiCH film by an excited plasma as described above. Thereafter, $CH_3$ groups contained in the SiCH film are substituted by O by a plasma obtained by activating oxygen gas in the processing vessel 1. The connecting (crystal) lattice is made smaller, and thus the porous SiCO film 41 is obtained. The SiCO film 41 is formed to have a thickness of, e.g., about 100 nm. The SiCO film 41 is a silicon carbide film containing, e.g., about 20 atomic % of oxygen. Since the SiCO film 41 is made porous as described above, a dielectric constant of the SiCO film 41 is lowered from 3.0 to about 2.2, for example. Thus, by combining the SiCO film 41 and the fluorine-added carbon film 40 to form the two-staged interlayer dielectric films, a dielectric constant of the overall dielectric films can be lowered.

Next, the SiCN film 42 is formed on the SiCO film 41 as described above. As shown in FIG. 8(b), the fluorine-added carbon film 40 is deposited on the SiCN film 42. This film deposition process is identical to that of the fluorine-added carbon film 91 in the first embodiment. The fluorine-added carbon film 40 is formed to have a thickness of, e.g., about 100 nm. Then, as shown in FIG. 8(c), the SiCN film 43 is deposited on the fluorine-added carbon film 40. This film deposition process is identical to that of the SiCN film 42. Each of the S iCN films 42 and 43 is, e.g., about 5 nm in thickness.

In this case, as described in the first embodiment, the upper SiCN film 43 may be a laminated structure including the SiC film 92 and the SiCN film 93.

As shown in FIG. 8(d), an $SiO_2$ film 44 that is a thin film serving as a hardmask is deposited on the SiCN film 43. This film is deposited by a plasma obtained by activating, for example, monosilane gas and oxygen gas. On the $SiO_2$ film 44, an $Si_3N_4$ film 45 and an $SiO_2$ film 46 made of TEOS and $O_2$ are deposited in this order. A thickness of the $Si_3N_4$ film 45 is, e.g., about 50 nm, and a thickness of the $SiO_2$ film 46 is, e.g., about 50 nm. Following thereto, although not shown, a resist film having a specific pattern is formed on the $SiO_2$ film 46. By etching the $SiO_2$ film 46 and the $Si_3N_4$ film 45 with the resist film used as a mask, patterns corresponding to that of the resist film are formed in the $SiO_2$ film 46 and the $Si_3N_4$ film 45.

As shown in FIG. 8(e), the $SiO_2$ film 46 is etched such that a center part of the etched pattern has a width L2, while the $Si_3N_4$ film 45 is etched such that a center part of the etched pattern has a width L1 that is small than the width L2. By using the patterns of the widths L2 and L1, the wafer W is etched so as to form a recess represented by the dotted line. Then, as shown in FIG. 8(f), copper 47 as a wiring metal is embedded in the thus etched recess. Thereafter, the copper 47 protruding from the recess 48 and an upper part of the $SiO_2$ film 44 is removed by the CMP process, for example, whereby the structure shown in FIG. 7 can be obtained.

According to this embodiment, since the interlayer dielectric film in this embodiment are formed by combining films of different kinds, i.e., the CF film (organic film) 40 and the SiCO film (inorganic film) 41, the following effects can be achieved. That is, in FIG. 8(e), an area with the width L1 surrounded by the dotted line is etched, and subsequently an area with the width L2 surrounded by the dotted line is etched. In the latter etching process, side surfaces of the recess in the inorganic SiCO film 41 are not etched, while the area with the width L2 of the organic CF film 40 is etched. Thus, a shape of the via-hole 48a can be properly retained. If a C—F linkage and an Si—O linkage are adjacent to each other, $SiF_4$ is disadvantageously generated to sublime during an annealing process. However, this embodiment can eliminate such a problem by physically separating the SiCO film 41 and the fluorine-added carbon film 40 from each other, by means of the SiCN film 42 as a protective film. In this embodiment, after the recess 48 is formed, the copper 47 as a wiring layer is embedded therein. At this time, the wafer W is once exposed to an atmospheric air. Upon this exposure, since the SiCO film 41 is porous, the SiCO film 41 tends to absorb moisture. Without the SiCN film 42, the moisture absorbed in the SiCO film 41 invades the fluorine-added carbon film 40. This is disadvantageous in that the moisture invading the fluorine-added carbon film 40 becomes CO and HF to escape as gas therefrom, so that the fluorine-added carbon film 40 loses in weight. However, since the SiCN film 42 is interposed between the SiCO film 41 and the CF film 40, invasion of the moisture absorbed in the SiCO film 41 into the fluorine-added carbon film 40 can be prevented. The SiCN film 43 on the fluorine-added carbon film 40 has a function for guarding the fluorine-added carbon film 40 against an attack by oxygen radicals that are used when depositing the $SiO_2$ film 44.

As has been described above, although the fluorine-added carbon film has excellent properties, a weak point thereof is that a nature of the fluorine-added carbon film is changed when it is attacked by oxygen, nitrogen, moisture, and so on. In addition, when a semiconductor device is manufactured, there may be a case in which it is difficult to form all the multi-layered interlayer dielectric films from fluorine-added carbon films. In this case, it can be considered to employ a conventional silicon-oxide based dielectric film, i.e., a dielectric film formed by laminating an SiOX film ("X" represents a given element or compound) and a fluorine-added carbon film. However, the following problem arises in this case.

When a film deposition temperature of the SiOX film is 400° C. or below, SiOH structures are inevitably generated in the film, although an amount thereof is small. After the film deposition process, when an annealing process (sintering process, for example) at a temperature of 400° C. or above is carried out, OH groups are disconnected from the SiOH structures, and a part thereof moves to an interface between the SiOX film and a fluorine-added carbon film. Then, F in the fluorine-added carbon film and the OH groups react to each other to generate HF, and then the HF and the SiOX film react to each other to generate $SiF_4$. These reactions degrade an adhesion between the fluorine-added carbon film and the SiOX film, resulting in peeling of the films away from each other.

This problem can be avoided by interposing the significantly thin SiCN film of the present invention between the SiOX film, such as the SiCO film 94 in the first embodiment and the $SiO_2$ film 44 and the SiCO film 41 in the third embodiment, and the fluorine-added carbon film. The SiCN film herein includes a laminated structure including the SiC film 92 and the SiCN film 93, as described in the first embodiment. A relative dielectric constant of the SiCN film is as high as 4.5, as compared with that of the fluorine-added carbon film. However, since a thickness of the SiCN film is very small, an increase in the overall relative dielectric constant can be prevented. For example, when a dielectric film is formed by a fluorine-added carbon film of 100 nm in thickness, and upper and lower SiCN films of 5 nm in thickness sandwiching the fluorine-added carbon film, a relative dielectric constant of the overall dielectric films is 2.3. Thus, in comparison with the fluorine-added carbon film having a relative dielectric constant of 2.2 in itself, an increase in the value is negligible, and such a dielectric film is capable of sufficiently functioning as a Low-k film. The "significantly thin" film means that the film has a thickness that can prevent an attack by oxygen, nitrogen, moisture, and so on, but does not increase the overall relative dielectric constant. A thickness of the film is preferably between 3 nm and 10 nm, and more preferably, between 5 nm to 8 nm. In place of SiCN, a material of the significantly thin dielectric film may be SiC (silicon carbide), SiN (silicon nitride), amorphous carbon, or the like.

Concrete examples corresponding to the above-described first to third embodiments are described below.

A. Deposition of Film Serving as Hardmask

Example 1

Example 1 corresponds to the second embodiment. With the use of the plasma processing apparatus shown in FIG. 1, a fluorine-added carbon film of 120 nm in thickness was deposited on a silicon bare wafer. The film deposition conditions were as follows: A power of a microwave was set at 3000 W, a process pressure was set at 10.6 Pa (80 mTorr), a temperature of the wafer was set at 380° C., and flow rates of $C_5F_8$ gas and Ar gas were set at 200 sccm and 100 sccm, respectively.

Then, an SiCN film of 50 nm in thickness was deposited on the fluorine-added carbon film by using the same plasma processing apparatus. The film deposition conditions were as follows: A power of a microwave was set at 1500 W, a process pressure was set at 39.9 Pa (300 mTorr), and a temperature of the wafer was set at 380° C. TMS gas (vapor) and Ar gas were supplied at flow rates of 40 sccm and 80 sccm, respectively. In addition, nitrogen gas was supplied at a flow rate of 50 sccm, after 5 seconds had passed from the beginning of the supply of the TMS gas and the Ar gas.

Example 2

Example 2 corresponds to the first embodiment. Similar to Example 1, a fluorine-added carbon film and an SiCN film were sequentially deposited on a silicon bare wafer. However, in this example, a thickness of the SiCN film was 5 nm, in view of a function of the SiCN film as a protective layer. Then, an SiCO film of 50 nm in thickness was deposited on the SiCN film by using the same plasma processing apparatus. The film deposition conditions were as follows: A power of a microwave was set at 1500 W, a process pressure was set at 33.3 Pa (250 mTorr), and a temperature of the wafer was set at 380° C. TMS gas and Ar gas were supplied at flow rates of 40 sccm and 200 sccm, respectively. In addition, oxygen gas was supplied at a flow rate of 10 sccm, after 5 seconds had passed from the beginning of the supply of the TMS gas and the Ar gas.

Example 3

Similar to Example 2, an SiCN film and an SiCO film were deposited on a fluorine-added carbon film in this order. However, in depositing the SiCN film, the initial step of supplying only TMS gas and Ar gas was not carried out, but TMS gas, Ar gas, and nitrogen gas were supplied from the beginning.

Comparative Example 1

Similar to Example 1, an SiCN film is laminated on a fluorine-added carbon film. However, different from Example 1, in depositing the SiCN film, the initial step of supplying only TMS gas and Ar gas was not carried out, but TMS gas, Ar gas, and nitrogen gas were supplied from the beginning at the above-described flow rates.

Comparative Example 2

Similar to Example 2, a laminated structure was manufactured. However, different from Example 2, an SiCO film was directly deposited on a fluorine-added carbon film, without interposing an SiCN film therebetween.

B. Observation of Adhesiveness of Films

The wafers of Examples 1 to 3 and Comparative Examples 1 and 2 were heated at 400° C. in a vacuum atmosphere, and then the wafers were left as they were for 30 minutes to 60 minutes. Thereafter, surfaces of the wafers were observed with naked eye, and peeling tests of the films were conducted by using an adhesive tape.

In the wafer of Comparative Example 1, some tarnishes (Blisters) caused by a generation of bubbles from the film were found, and a small part of the film was peeled. On the other hand, in the wafer of Example 1, no tarnish like that of Comparative Example 1 was found, and no part of the film was peeled. Thus, it is demonstrated that, when an SiCN film is deposited on a fluorine-added carbon film, an adhesion of the SiCN film to the fluorine-added carbon film can be enhanced, not by supplying nitrogen gas at an initial step of the film deposition process, but by supplying only TMS gas and Ar gas at the initial step.

In the wafer of Example 2, no tarnish as described above was found, and no part of the film was peeled. This result seems natural because the SiCN film was deposited in the same manner as Example 1, and the SiCO film and the SiCN film have an SiC base in common, the films are considered to be an integrated one.

In examining the results of Example 3 relative to Comparative Examples 1 and 2, the result of Example 3 was the same as that of Comparative Example 1, but was superior to that of Comparative Example 2. That is, in the wafer of Comparative Example 2, the greater number of the tarnishes as described above were found, as compared with the wafer of Example 3, and a most part of the film was peeled. In view of this result, it is understood that an adhesion between the film of the wafer of Example 3 is more excellent than that of Comparative Example 2. Thus, when an SiCO film is used as a hardmask, it is preferable to interpose an SiCN film between a fluorine-added carbon film and an SiCO film. The result shows that, when depositing the SiCN film, it is more preferable not to supply nitrogen gas at an initial step of the film deposition process, but to supply only TMS gas and Ar gas at the initial step.

C. Reference Experiment

Figure 9:
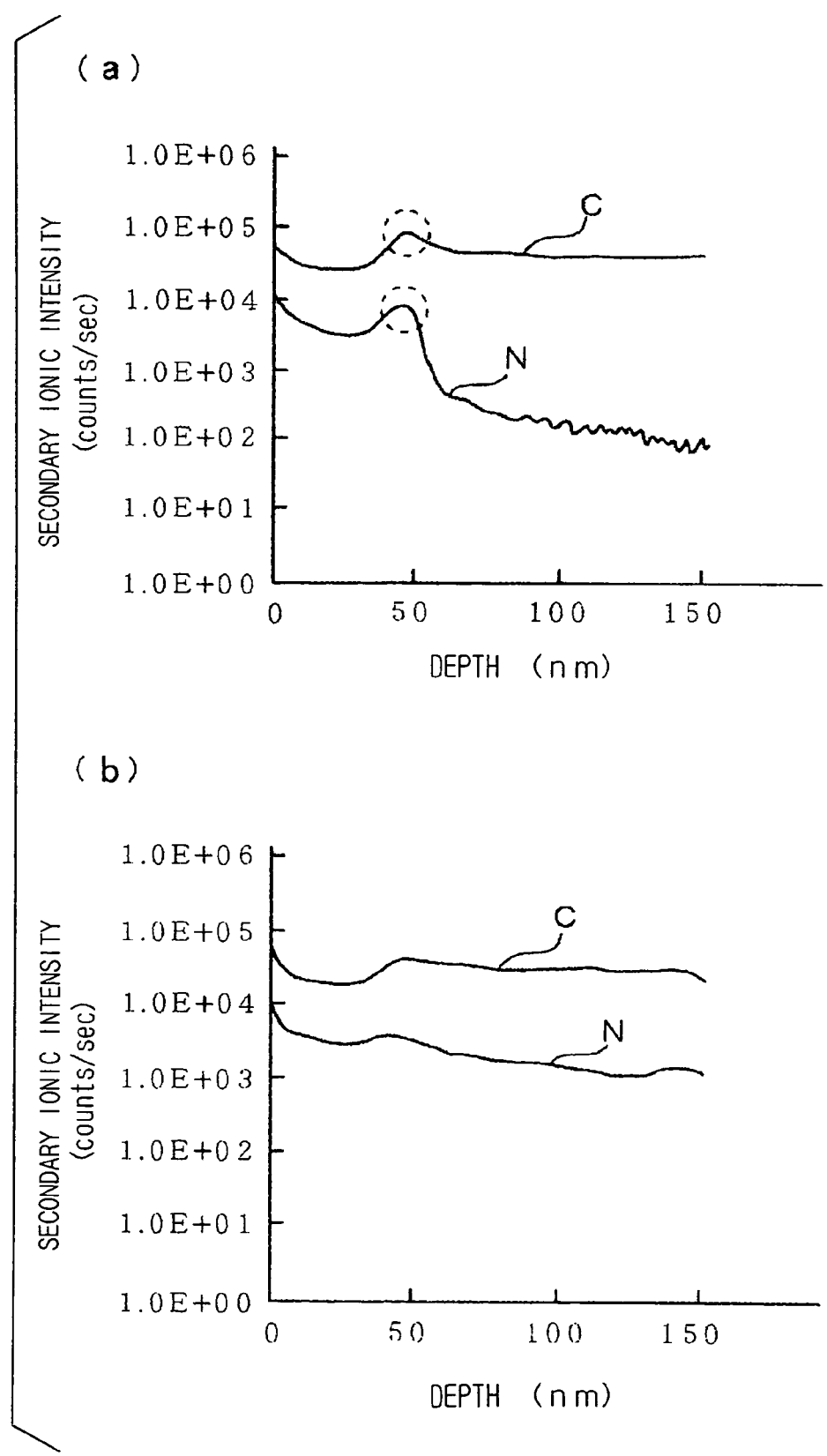
FIG. 9 is a graph of a result of a referential experiment conducted in relation to the present invention.

Densities of carbon and nitrogen in a depth direction of the laminated structure of Example 1 were examined by an SIMS (secondary ion mass spectrometry) with a secondary ionic intensity (strength) as an index. FIG. 9(a) shows the result. On the other hand, a similar examination was conducted for a laminated structure obtained by exposing the fluorine-added carbon film in Example 1 to a nitrogen plasma for 60 seconds, before TMS gas and Ar gas were supplied. FIG. 9(b) shows the result.

FIG. 9(a) shows that the densities of the carbon and the nitrogen are high (parts surrounded by the dotted line) at the position 50 nm in depth, which position corresponds to the interface between the SiCN film and the fluorine-added carbon film. The density of the nitrogen in the fluorine-added carbon film is outstandingly lowered from the interface between the same and the SiCN film, and is lowered one tenth or below in maximum. On the other hand, FIG. 9(b) does not show these aspects shown in FIG. 9(a).

In view of the result, it is supposed that the adhesion of the SiCN film to the fluorine-added carbon film is deteriorated by the estimation that nitrogen invades the fluorine-added carbon film during a film deposition process of the SiCN film, and the nitrogen is released as a degassing when the wafer is heated. On the other hand, when the films are deposited in the manner of Example 1, a layer with a high carbon density, that is, a carbon-rich layer is formed on the interface. The carbon-rich layer traps nitrogen in a nitrogen plasma to which the wafer is subsequently exposed, so as to prevent an invasion of the nitrogen into the fluorine-added carbon film. Therefore, it is supposed that the SiCN film can have a remarkably improved adhesion.

The invention claimed is:

1. A manufacturing method of a semiconductor device, comprising the steps of:
   depositing on a substrate, on a surface of which a wiring is formed, a dielectric film made of fluorine-added carbon;
   forming on the dielectric film an adhesion layer including silicon and carbon;
   forming on the adhesion layer a protective layer comprising a nitrogen-added silicon carbide film;
   depositing on the protective layer a film made of oxygen-added silicon carbide by a plasma containing active species of silicon, carbon, and oxygen; and
   obtaining a hardmask having a predetermined pattern by etching the film.

2. The manufacturing method according to claim 1, wherein
   the plasma containing active species of silicon, carbon, and oxygen is obtained by activating a gas of an organic silicon compound and an oxygen gas.

3. The manufacturing method according to claim 2, wherein
   the step of forming the protective layer includes the step of depositing on the adhesion layer the nitrogen-added silicon carbide film by a plasma containing active species of an organic silicon compound and an active species of nitrogen.

4. The manufacturing method according to claim 1, wherein
   the step of forming the adhesion layer includes the step of depositing on the dielectric film a silicon carbide film by a plasma containing active species of silicon and carbon.

5. The manufacturing method according to claim 1, wherein
   the step of forming the adhesion layer includes the step of depositing on the dielectric film a silicon carbide film by a plasma obtained by activating a gas of an organic silicon compound.

6. The manufacturing method according to claim 1, wherein
   the step of forming the protective layer includes the step of depositing on the adhesion layer the nitrogen-added silicon carbide film by a plasma containing active species of silicon, carbon, and nitrogen.

7. The manufacturing method according to claim 1, further comprising of the step of
   etching the dielectric film by a plasma through the hardmask.

8. The manufacturing method according to claim 1, wherein
   the step of depositing the film serving as a hardmask includes the sub-steps of:
   depositing a first film made of a silicon carbide by a plasma containing active species of silicon and carbon, and
   depositing a second film made of an oxygen-added silicon carbide by a plasma containing active species of silicon, carbon, and oxygen.

* * * * *